(12) United States Patent
Eustis et al.

(10) Patent No.: US 6,944,075 B1
(45) Date of Patent: Sep. 13, 2005

(54) VARIABLE COLUMN REDUNDANCY REGION BOUNDARIES IN SRAM

(75) Inventors: Steven M. Eustis, Essex Junction, VT (US); Michael T. Fragano, Essex Junction, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,451

(22) Filed: Jan. 5, 2005

(51) Int. Cl.⁷ .............................................. G11C 7/00
(52) U.S. Cl. .................. 365/200; 365/230.06; 711/718
(58) Field of Search .......................... 365/200, 230.06, 365/63; 714/718, 711

(56) References Cited

U.S. PATENT DOCUMENTS

| | | | |
|---|---|---|---|
| 5,349,558 A | 9/1994 | Cleveland et al. | |
| 6,002,633 A | 12/1999 | Oppold et al. | |
| 6,067,259 A | 5/2000 | Handa et al. | |
| 6,282,131 B1 * | 8/2001 | Roy | 365/191 |
| 6,292,427 B1 * | 9/2001 | Roy | 365/230.03 |
| 6,411,557 B2 | 6/2002 | Terzioglu et al. | |
| 2003/0107408 A1 | 6/2003 | Afghahi et al. | |
| 2003/0147292 A1 | 8/2003 | Ladner et al. | |
| 2004/0015651 A1 * | 1/2004 | Chadwick et al. | 711/108 |

* cited by examiner

Primary Examiner—Son T. Dinh
Assistant Examiner—Hien Nguyen
(74) Attorney, Agent, or Firm—Greenblum & Bernstein, P.L.C.; Michael J. LeStrange

(57) ABSTRACT

A method of assigning bits to redundant regions for variable bit redundancy region boundaries in a compliable memory such as a 1-port SRAM is provided. Methods include allocating bits between the redundant regions in nearly equal proportions while minimizing the amount of chip real estate consumed by the memory. Methods also includes allocating bits in equal portions between redundant regions while occupying slightly more memory chip real estate. Methods also allocate bits into redundant regions with a simplified procedure which may or may not allocate bits into the redundant regions in equal proportions. All of the methods allow the total number of memory bits in the complied memory to be re-defined while maintaining the same allocation characteristics for each method. Accordingly, the methods allow efficient use of redundant memory bits while also conserving chip real estate or offering simplified allocation steps.

20 Claims, 12 Drawing Sheets

FIG. 10

MAXRED = 72, BLR = 8, BHLR = 4
Bits ≤ 72 – all in Region A

| Method 1 | Method 2 | Method 3 |
|---|---|---|
| 73 – 36A,37B | 37A,36B | 72A,1B |
| 74 – 36A,38B | 37A,37B | 72A,2B |
| 75 – 36A,39B | 38A,37B | 72A,3B |
| 76 – 36A,40B | 38A,38B | 72A,4B |
| 77 – 40A,37B | 39A,38B | 72A,5B |
| 84 – 40A,44B | 42A,42B | 72A,12B |
| 85 – 44A,41B | 43A,42B | 72A,13B |
| 92 – 44A,48B | 46A,46B | 72A,20B |
| 93 – 48A,45B | 47A,46B | 72A,21B |
| 100– 48A,52B | 50A,50B | 72A,28B |
| 101– 52A,49B | 51A,50B | 72A,29B |
| 108– 52A,56B | 54A,54B | 72A,36B |
| 109 –56A,53B | 55A,54B | 72A,37B |
| 116 – 56A,60B | 58A,58B | 72A,44B |
| 117– 60A,57B | 59A,58B | 72A,45B |
| 124 –60A,64B | 62A,62B | 72A,52B |
| 125 – 64A,61B | 63A,62B | 72A,53B |
| 132 – 64A,68B | 66A,66B | 72A,60B |
| 133 – 68A,65B | 67A,66B | 72A,61B |
| 140 – 68A,72B | 70A,70B | 72A,68B |
| 141 – 72A,69B | 71A,70B | 72A,69B |
| 144 –72A,72B | 72A,72B | 72A,72B |
| 145 –48A,48B,49C | 49A,48B,48C | 72A,72B,1C |
| 148 –48A,48B,52C | 50A,49B,49C | 72A,72B,4C |
| 149 –48A,52B,49C | 50A,50B,49C | 72A,72B,5C |
| 150 –48A,52B,50C | 50A,50B,50C | 72A,72B,6C |
| 151 –52A,48B,51C | 51A,50B,50C | 72A,72B,7C |
| 152 –52A,48B,52C | 51A,51B,50C | 72A,72B,8C |
| 153 –52A,52B,49C | 51A,51B,51C | 72A,72B,9C |
| 156 –52A,52B,52C | 52A,52B,52C | 72A,72B,12C |
| Etc. | | |

FIG. 11

MAXRED = 72, BLR = 16, BHLR = 8
Bits ≤ 72 – all in Region A

| Method 1 | Method 2 | Method 3 |
|---|---|---|
| 73 – 40A,33A | 37A,36B | 72A,1B |
| 74 – 40A,34A | 37A,37B | 72A,2B |
| 75 – 40A,35A | 38A,37B | 72A,3B |
| 76 – 40A,36A | 38A,38B | 72A,4B |
| 86 – 40A,46A | 43A,43B | 72A,14B |
| 87 – 40A,47A | 44A,43B | 72A,15B |
| 88 – 40A,48A | 44A,44B | 72A,16B |
| 89 – 48A,41A | 45A,44B | 72A,17B |
| 104 – 48A,56A | 52A,52B | 72A,32B |
| 105 – 56A,49A | 53A,52B | 72A,33B |
| 120 – 56A,64B | 60A,60B | 72A,48B |
| 121 – 64A,57B | 61A,60B | 72A,49B |
| 136 – 64A,72B | 68A,68B | 72A,64B |
| 137 – 72A,72B | 69A,68B | 72A,65B |
| 144 – 72A,65B | 72A,72B | 72A,72B |
| 145 – 48A,48B,49C | 49A,48B,48C | 72A,72B, 1C |
| 152 – 48A,48B,56C | 51A,51B,50C | 72A,72B,8C |
| 153 – 48A,56B,49C | 51A,51B,51C | 72A,72B,9C |
| 155 – 48A,56B,51C | 52A,52B,51C | 72A,72B,11C |
| 156 – 56A,48A,52C | 52A,52B,52C | 72A,72B,12C |
| 160 – 56A,48B,56C | 54A,53B,53C | 72A,72B,16C |
| 161 – 56A,56B,49C | 54A,54B,53C | 72A,72B,17C |
| 168 – 56A,56B,56C | 56A,56B,56C | 72A,72B,24C |

US 6,944,075 B1

VARIABLE COLUMN REDUNDANCY REGION BOUNDARIES IN SRAM

FIELD OF THE INVENTION

The invention relates to structuring memory, and more particularly to creating redundant regions in compilable SRAM memory.

BACKGROUND DESCRIPTION

As the size of memory systems increase, it becomes advantageous to configure the memory system to have at least one redundant bit which is available to replace a defective bit in the memory system. For example, a memory system such as a static random access memory ("SRAM") will have circuitry forming multiple bits which form the memory system. If any of the bits are defective at the end of the manufacturing process, the memory system will not function properly. Accordingly, it is advantageous for a redundant bit to be formed during the formation of the main memory, where the redundant bit is configured so that it can substitute for a defective bit of the memory system. Thus, the memory system having a defective bit will still function properly due to substitution of the redundant bit for the defective bit.

As memory systems become larger and incorporate more bits, the number of available redundant bits is increased to accommodate a larger number of potential defective bits. But, in such known types of memory structure, a redundant bit is available to replace only a certain number of bits in a memory system. This certain number of bits is referred to as a redundant region. Accordingly, in some memory systems, a particular redundant bit can replace a bit only in its corresponding redundant region. This is akin to a "static" system.

Alternatively, certain memory designs allow for row redundancy. Row redundancy is a memory system configuration where a redundant row is created and is able to replace a defective row in the memory system. Typical memory system configurations allow a redundant row to replace any row of a memory system. Furthermore, a memory system can have multiple redundant rows and each one of those redundant rows can replace any defective row in the memory system. However, an entire row must be replaced in such configurations.

It should also be noted that a non-compilable memory allows the memory designer to pre-determine the size of a redundant region and because the size of the memory does not vary, that redundant region will be fixed. However, for a compilable memory, the size of the memory is not fixed and thus, virtually any size memory up to a prescribed limit may be formed. Accordingly, a simplified method for configuring the redundant regions of a compilable memory with varying memory size, such as a SRAM is needed.

Bit redundancy has been utilized in compiled SRAMs, though. In these configurations, one redundant bit is provided per compiled memory. The extra bit is added to the end of the memory and steered appropriately to replace a defective bit in the memory. This bit redundancy is sometimes called column redundancy because it is orthogonal to row redundancy. Each bit of a memory is steered to one or more columns of data, depending on bit decode. For example, in a memory that has a bit decode of 8, each bit represents 8 columns of data. When a defective bit is replaced with a redundant bit, all 8 columns of data would be replaced.

As memory systems have grown larger, having one redundant bit for the entire memory system has become inadequate. As the number of bits has grown, the redundant bit must serve an ever increasing number of bits thereby increasing the chances that the memory will be defective because there will be more than one defective bit. Thus it is desired to have more than one redundant bit in large memories. Each redundant bit will be assigned to a group of bits called a redundancy region. Each redundant bit can only replace a defective bit within its region.

Also as memory systems have grown larger, memory performance has been improved by dividing the memory system into subsets of memory called local sections, each with their own redrivers of the main signal lines. Each local section of the memory system can be accessed simultaneously, but the redrivers require special addressing schemes. Because these larger memory systems require more than one redundant bit, and because redrivers are typically oriented along a column of memory, rather than a row, the special addressing requirements of the local redriver system prevent the border between redundant bit regions from occurring at any arbitrary location in the memory.

Also, high performance architecture is defined to have redrivers every fixed number of data bits, with the number of redrivers being added as the number of data bits increases. In such a system, at the end of the array, a "partial" redriver might be needed if the leftover number of bits is not equal to the full multiple of redrivers. Thus, in order to properly incorporate the column redundancy control signals, each side of a redriver must only be part of one redundant region. In other words, a redundant region can not cross redriver boundaries. For example, if an SRAM had 8 data bits per local redriver, then a column redundant region boundary can only fall in multiples of 4 bits such that each half redriver can drive to a separate redundant region or the whole redriver will drive to the same redundant region.

SUMMARY OF THE INVENTION

In a first aspect of the invention, a method of creating a redundancy region in a compilable memory includes the steps of determining a total number of bits for a memory, and determining a maximum allowable number of bits for a redundant region. The method also includes determining a total number of redundant bits based on a lowest integer which includes a ratio of the total number of bits for a memory to the maximum allowable number of bits for a redundant region. The method additionally includes creating at least one redundant region in the memory based on the total number of redundant bits, and assigning a number of bits to the at least one redundant region.

In another aspect of the invention, a method of creating a redundancy region in a compilable memory includes the steps of defining a total number of bits for a memory, and defining a maximum allowable number of bits for a redundant region of the memory, where a redundant bit may replace any one of the bits in a corresponding redundant region. The method also includes defining an actual number of redundant bits for the memory as the lowest integer which is equal to or greater than the ratio of the total number of bits in the memory to the maximum number of allowable bits of a redundant region. Additionally, the method includes defining an actual number of bits for a first redundant region as the lowest integer which is equal to or greater than the ratio of the total number of bits for the memory to the actual number of redundant bits for the memory. The method further includes configuring the memory so that a first redundant bit of the number of redundant bits may replace any bit of the actual number of bits for the first redundant region.

A computer program product is also provided which includes a computer usable medium having readable program code embodied in the medium, the computer program product includes at least one component to determine a total number of bits for a memory, and determine a maximum allowable number of bits for a redundant region. The computer program product also includes one or more components to determine a total number of redundant bits based on a lowest integer which includes a ratio of the total number of bits for a memory to the maximum allowable number of bits for a redundant region. Additionally, the one or more components create at least one redundant region of the memory based on the total number of redundant bits, and assign a number of bits to the at least one redundant region.

BRIEF DESCRIPTION OF THE DRAWINGS

FIG. 10 shows examples of redundant region sizes in memories for various methods in accordance with the invention;

FIG. 11 shows examples of redundant region size in a memories for various methods in accordance with the invention.

DETAILED DESCRIPTION OF EMBODIMENTS OF THE INVENTION

Figure 1:
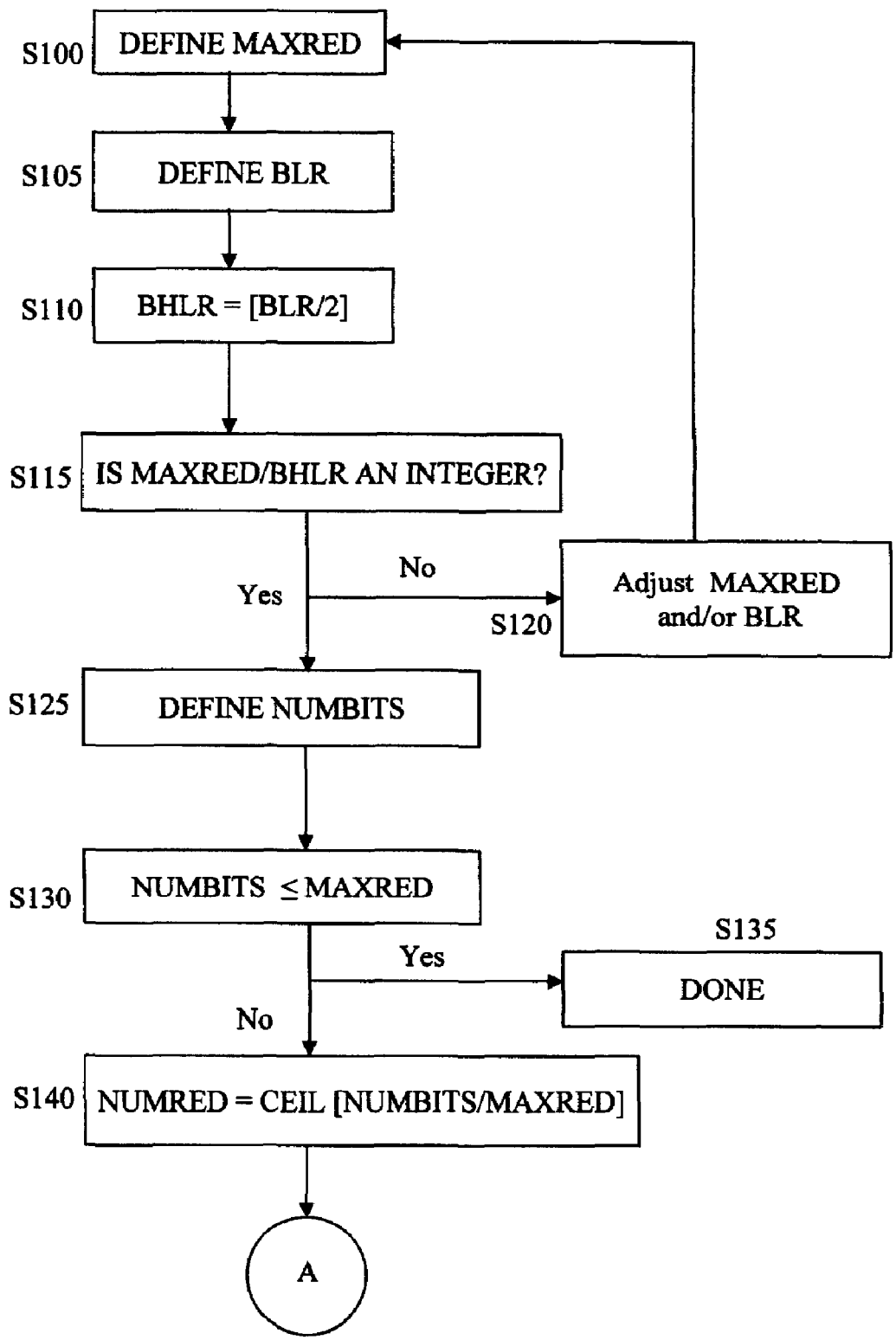
FIGS. 1 and 2 are a flow chart of a method of determining the size of a redundant region in a memory in accordance with the invention.

The invention improves manufacturing yield of memory devices, such as compilable SRAM and in particular, compilable 1-port SRAM, by allowing a more efficient use or allocation of redundant bits. Efficient use of redundant bits increases the likelihood that when a bit is defective in a memory, a redundant bit will be available to replace the defective bit. Additionally, embodiments of the invention allow maximizing the efficiency of redundant bit usage, while minimizing non-usable chip real estate consumed by the memory system on a chip. In embodiments of the invention, these advantages may be achieved, in one example, by creating redundant regions in a memory where the size of the redundant regions are substantially equal to one another and the number of redundant regions corresponds to the number of available redundant bits and by minimizing the number of partial redrivers.

In general, the number of bits for redundant regions, based on the total memory size and the number of available redundant bits is determined. If there is one redundant bit, then a single region has all the memory bits. If there are two redundant bits, the number of bits for a first redundant region is determined and the remaining bits are then fit into a second redundant region. In embodiments, the second redundant region is of equal or about equal size compared to the first redundant region. The process is similar for three or more redundant bits, and the process can be repeated until all bits in the memory are grouped into redundant regions and have been assigned a corresponding redundant bit.

Additionally, some memory fabrication systems allow a memory user to request memory systems having certain memory parameters such as the total number of bits, and then have a memory with a pre-determined memory architecture such as maximum number of bits in a redundant region, number of redundant bits, bits per local redriver, etc. built to the requested parameters. Such memory systems are referred to as compilable memory. During the manufacturing process of a compilable memory, a memory-user's requested parameters are combined with the predetermined memory architecture in a compiler or software tool to assemble, tile or make the memory. The output of the compiler may include a graphical representation of the memory system suitable for forming lithographic masks. Accordingly, the compiler incorporates a memory-user's requested parameters into a predetermined memory architecture and tiles subcomponents to create a memory system and outputs a memory design in the form of, for example, a graphical image from which to form a photolithographic mask or other data suitable for mask formation.

In other words, memory fabrication may be divided in two different processes. In the first process, the memory development phase, the development team determines the various parameters associated with the memory compiler based on manufacturing defect density as well as desired memory performance and density. The first aspect to determine is the maximum number of bits that one redundant bit can serve, MAXRED. The number of bits per local redriver, BLR, and number of bits per half local redrive, BHLR, also need to be chosen. Some of the embodiments require a certain relationship to exist between these parameters.

Once the memory compiler has been developed and qualified for manufacturing, the second process can take place, i.e., customer ordering. A customer's job is to determine how many bits are needed for a given instance of the memory, NUMBITS. Once NUMBITS is known, the developed compiler will follow a process, for example, the various embodiments outlined to allocate the size of the various redundancy regions and create a physical representation of the memory to be integrated with the rest of the chip design.

FIGS. 1–6 are flow diagrams of an embodiment of the invention showing steps of using the invention. FIGS. 1–6 may equally represent high-level block diagrams of components of the invention implementing the steps thereof. The steps of FIGS. 1–6 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code may be transferred to a workstation over the internet or other type of data transfer network. FIGS. 1–6 may also be implemented, for example, using a computer or other type of microprocessor.

Figure 2:
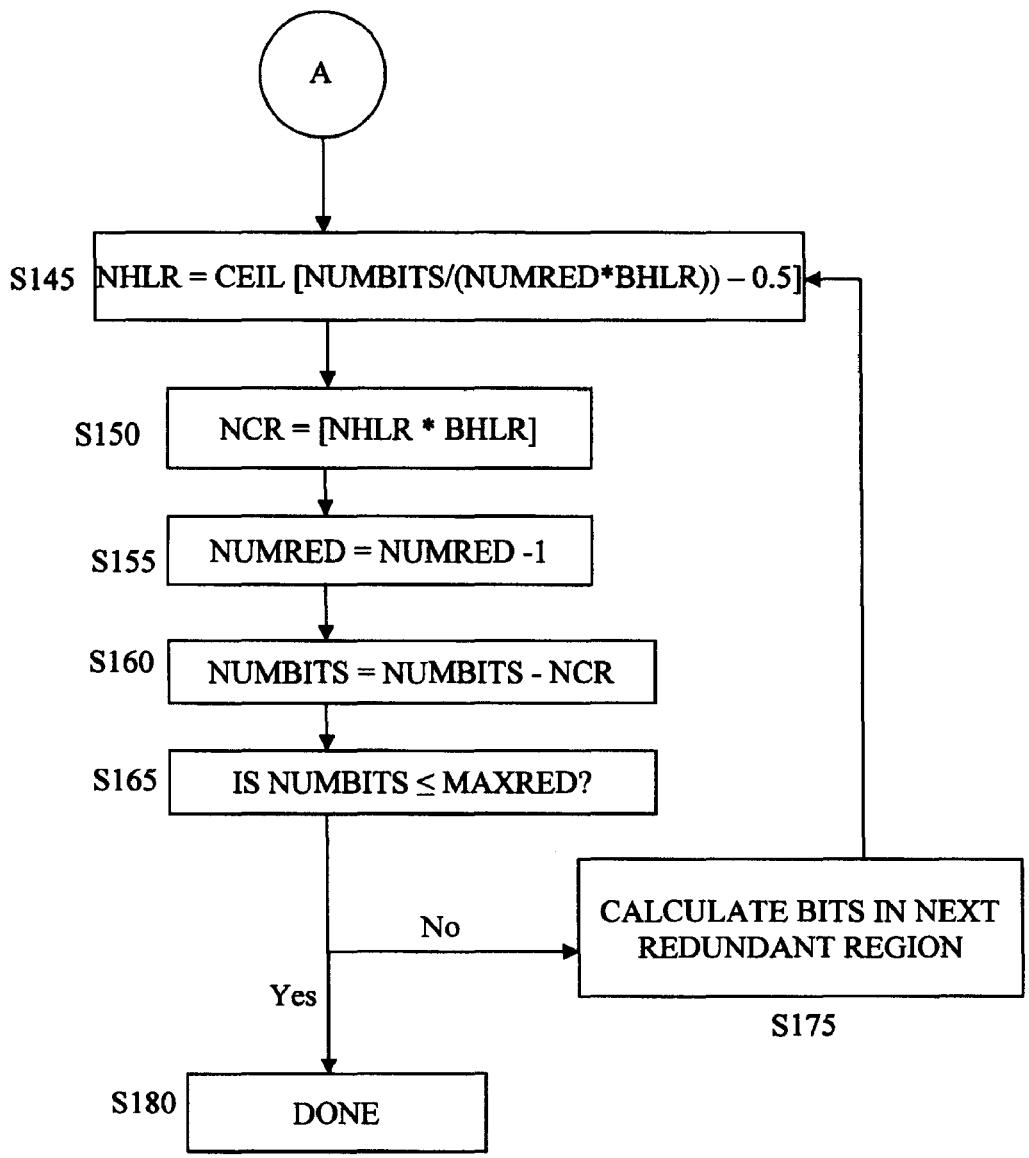

Referring now to FIGS. 1 and 2, an embodiment for achieving near equal redundancy allocation between redundant regions within a memory while minimizing area in accordance with the invention is shown. MAXRED is defined as a maximum number of bits in a redundant region which correspond to a redundant bit (S100). Accordingly, a redundant bit can replace any defective bit in its corresponding redundant region.

BLR is defined as the number of bits in a local redriver (S105). The number of bits for a half local redriver, BHLR, is defined as BLR divided by 2 (S110). After BHLR is defined, it is determined whether MAXRED/BHLR is an integer (S115). If MAXRED/BHLR is not an integer, MAXRED and/or BLR are adjusted (S120) and the logic flow goes back to S100.

NUMBITS is defined as the total number of bits in a memory (S125). Because the memory system is a compilable SRAM, NUMBITS may be defined by an SRAM user with the memory system being fabricated to have a total number of bits corresponding to NUMBITS as defined by the SRAM user. Next, NUMBITS is compared to MAXRED to determine whether NUMBITS is less than or equal to MAXRED (S130). If NUMBITS is less than or equal to MAXRED, all the bits of the memory system fall into a single redundant region, and the redundancy allocation is complete (S135).

NUMRED is defined as the total number of redundant bits allocated for the entire memory, and is set equal to the ceiling function of [NUMBITS/MAXRED]. In other words, the ceiling function is applied to the ratio of NUMBITS to MAXRED where the ceiling function rounds up to the next highest integer if the ratio of NUMBITS to MAXRED is not an integer, otherwise the ceiling function leaves the ratio of NUMBITS to MAXRED as the resulting integer (S140).

After NUMRED is determined, the number of half local redrivers in the current redundant region is defined as NHLR, where NHLR equals CEIL [(NUMBITS/(NUMRED*BHLR) −0.5] (S145). In other words, NUMBITS is divided by the product of NUMRED and BHLR and 0.5 is subtracted from the resulting value and a ceiling function applied thereto.

The number of bits in a current redundant region is defined as NCR and is equal to the product of NHLR and BHLR (S150). Accordingly, NCR is the number of bits in a first redundant region which a corresponding redundant bit is available to replace. After the number of redundant bits in a first current region is determined, it is determined whether there is another redundant region for which to calculate the number of redundant bits. Accordingly, NUMRED is set equal to NUMRED minus 1 (S155), NUMBITS is set equal to NUMBITS minus NCR (S160) and it is determined whether NUMBITS is less than or equal to MAXRED (S165).

If NUMBITS is not less than or equal to MAXRED, then an additional redundant region is needed (S175) and the logic flow resets itself to S145 to calculate a new NHLR with the new NUMRED and NUMBITS values. Thus, any further calculation of the number of bits in the next redundant region will not include the number of bits in the redundant region if further redundant regions should be determined to be necessary. If the revised NUMBITS is less than or equal to MAXRED, all of the remaining bits in the memory are in the final redundant region, and the logic flow stops (S180).

Accordingly, once the total number of bits in the memory (NUMBITS), the maximum number of bits in a redundant region (MAXRED), and the number of bits per local redriver (BLR), are determined, the above method can be applied to determine the number of actual bits in each redundant region to achieve near equal redundancy allocation between redundancy regions while minimizing real estate occupied by the memory.

In other words, multiple redundant regions or elements are split nearly equally among the data bits, while obeying the redriver restrictions. Where, for example, the maximum number of bits one redundant bit can replace (MAXRED) is 72, the number of bits per local redriver (BLR) is 8, and the bits per half local redriver (BHLR) is 4, then MAXRED/BHLR is 18 which is an integer and allowed. If the SRAM has 73 bits then the number of redundant bits (NUMRED) is 2. The number of half local redrivers in the current region (NHLR) is CEIL[73/(2*4)−0.5] is 9. That makes the number of bits in the current region (NCR) 36. The leftover bits (73−36=37) are then placed in the second region. In this example, the allocation of bits among the two redundant regions is very close to 50%. Examining the method further, one can see that there will be 36 bits in the first region for a total count of 73, 74, 75 and 76. At 77 total bits, the bit number in the first region jumps to 40 with the second region having the leftover 37 bits.

Note that MAXRED should be an integer multiple of BHLR. This is so that the redriver boundaries are always in the same region. Note also that there would be no extra partial local redrivers with this approach because there will always be a series of full local redrivers followed potentially by a partial at the end of the memory. This means that there is no extra area used by this technique.

Figure 3:
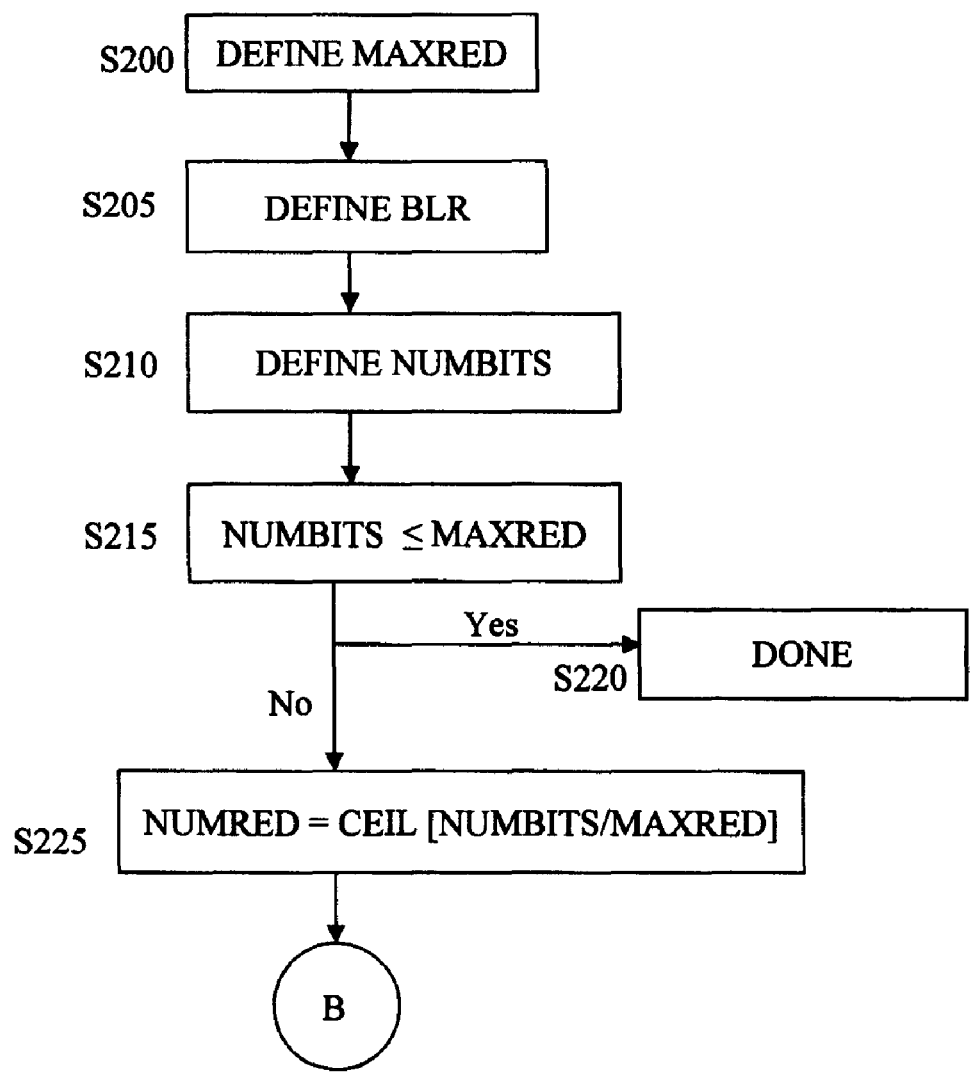
FIGS. 3 and 4 are a flow chart of a method of determining a size of a redundant region in a memory in accordance with the invention.
Figure 4:
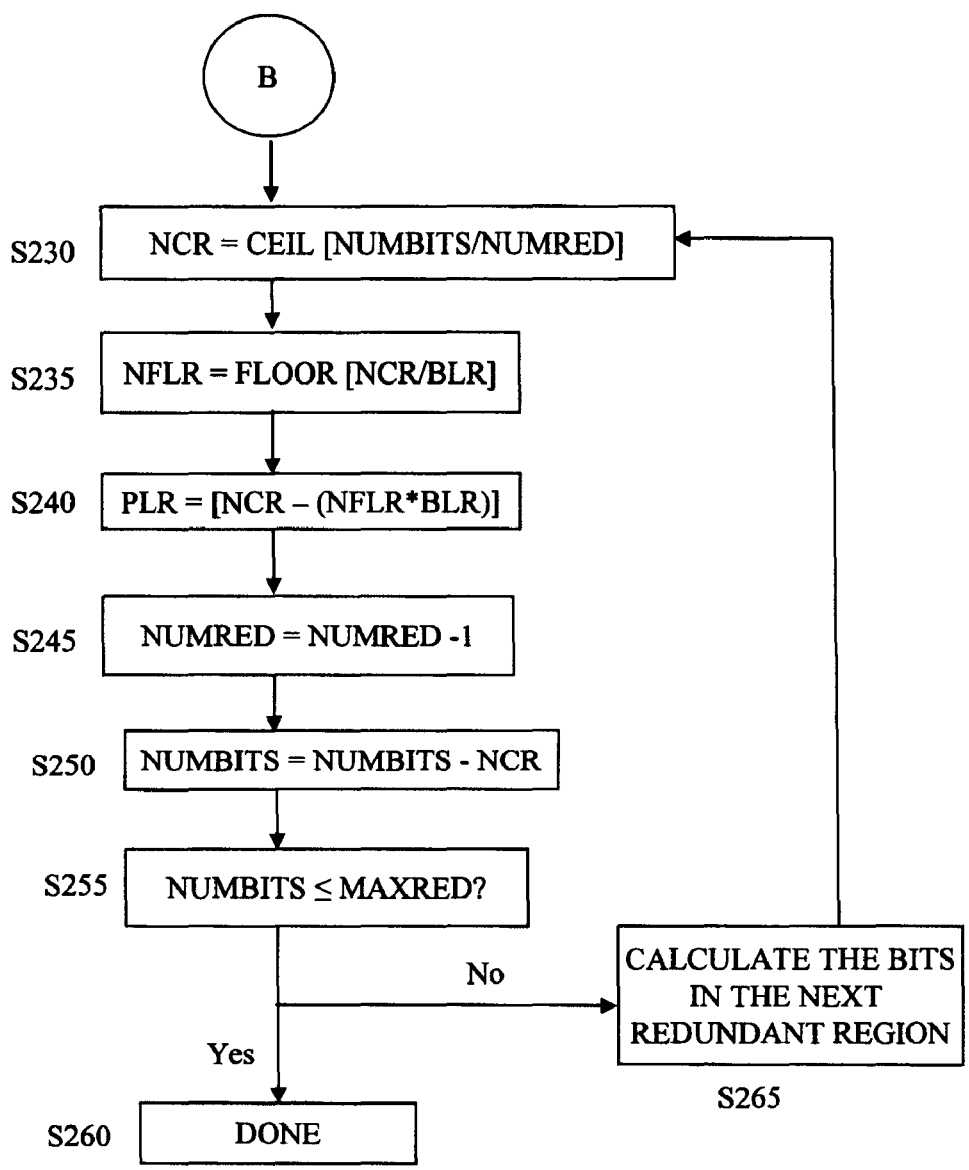

Referring to FIGS. 3 and 4, another embodiment of variable column redundancy region determination at the expense of some chip real estate, which achieves equal redundancy allocation between redundancy regions, is shown. In this example, the starting variables are similar to the variables of the example shown in FIGS. 1 and 2. In particular, MAXRED is defined as the maximum of number of bits in a redundant region which a corresponding redundant bit is available to replace (S200). The number of bits per local redriver is defined as BLR (S205). Additionally, NUMBITS is defined as the total number of bits in the memory (S210). It is determined whether NUMBITS is less than or equal to MAXRED (S215). If NUMBITS is less than or equal to MAXRED, all the bits are in a redundant region, i.e., already allocated, and the logic flow is complete (S220).

If NUMBITS is not less than or equal to MAXRED, further allocation is required and NUMRED is defined as the number of redundant bits available for replacing a defective bit in the memory, and is set equal to the ceiling function of the ratio of NUMBITS to MAXRED (S225). The number of bits in the current redundant region is defined as NCR which equals the ceiling function of the ratio of NUMBITS to NUMRED (S230).

Next, the number of full-sized local redrivers in the current redundant region is set equal NFLR which equals the floor function of the ratio of NCR to BLR (S235). Also, the size of a partial local redriver in the current redundant region is defined as PLR and equals NCR minus the product of NFLR and BLR (S240).

Next, it is determined whether another redundant region is required including setting NUMRED equal to NUMRED minus 1 (S245) and setting NUMBIT equal to NUMBIT minus NCR (S250). As in the previous example, NUMBITS now excludes the number of bits in the first redundant region already calculated. Next, it is determined if NUMBITS is less than or equal to MAXRED (S255). If NUMBITS is less than or equal to MAXRED, the logic flow is complete (S260) and all remaining bits go into the final redundant region. If NUMBITS is not less than or equal to MAXRED, another redundant region is needed (S265) and the logic flow returns to S230. Accordingly, a new value for NCR is calculated with the new values of NUMBITS and NUMRED (S265), and the logic flows continues until no more redundant regions are required. Thus, the example of FIGS. 3 and 4 allows achieving equal redundancy allocation of bits between all of the redundant regions, but may require an extra redriver, and thus may occupy more real estate on the chip.

In other words, in the second method, the redundancy allocation can be within one bit of 50% in all cases. For this method, a series of full local redrivers are used followed by a potential partial local redriver in a redundant region, followed by a series of full local redrivers and a potential partial local redriver in another redundant region. With some bit counts however, this leads to extra redrivers being used which consumes extra chip area. For medium performance designs (those with a high number of bits per local redriver) or those with a small number of bits per redundant bit, this method can be superior.

For example, if the maximum number of bits one redundant bit can replace (MAXRED) is 72, the number of bits per local redriver (BLR) is 8, and the SRAM has 73 bits, then the number of redundant bits (NUMRED) is 2. The number of bits in the current redundant region (NCR) is CEIL [73/2]=37. The number of full sized local redrivers in the current redundant region (NFLR) is FLOOR [37/8]=4. Thus the size of the partial redundant redriver (PLR)=37−(8*4)=5. The number of bits in the second region would be the remainder of bits or 73−37=36. With this method, the allocation of bits among the two redundant regions is always within one bit of 50%. Examining the method further one can see that as the total bit count grows from 73, the split between redundant regions will be 37/36, 37/37, 38/37, 38/38, etc.

In another example using the second method, assume MAXRED stays at 72, but BLR now equals 72 because this design is a medium performance design (fewer redrivers per given number of bits). With a 73 bit design, NUMRED=2. NCR still equals 37, but is entirely within a partial local redriver. The method causes a medium performance design to have one partial redriver in each region until a full size redriver in each is reached. In contrast, using the first method, the allocation split for an SRAM with a large BLR may be relatively uneven.

Figure 5:
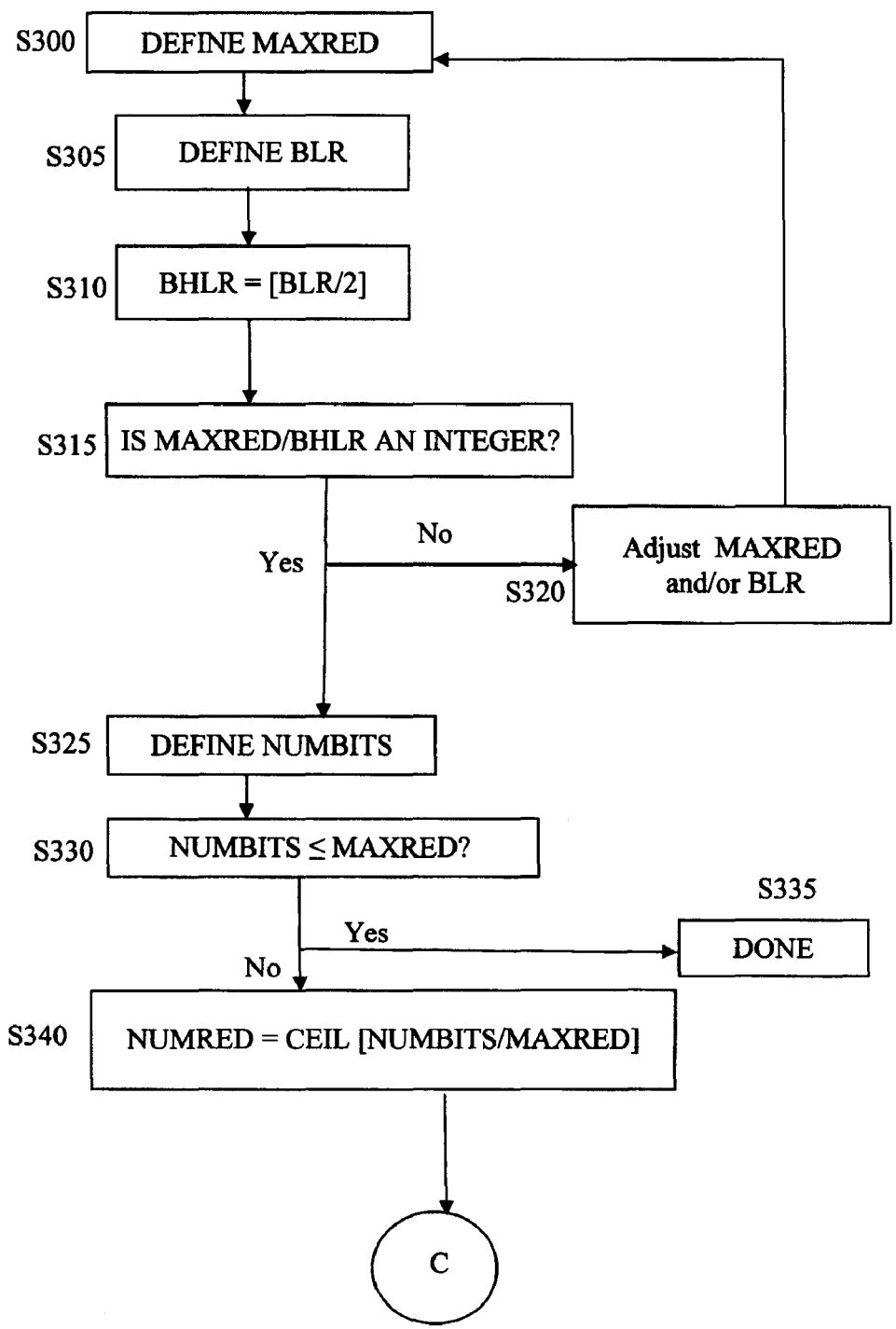
FIGS. 5 and 6 are a flow chart of a method of determining a size of a redundant region in a memory in accordance with the invention.
Figure 6:
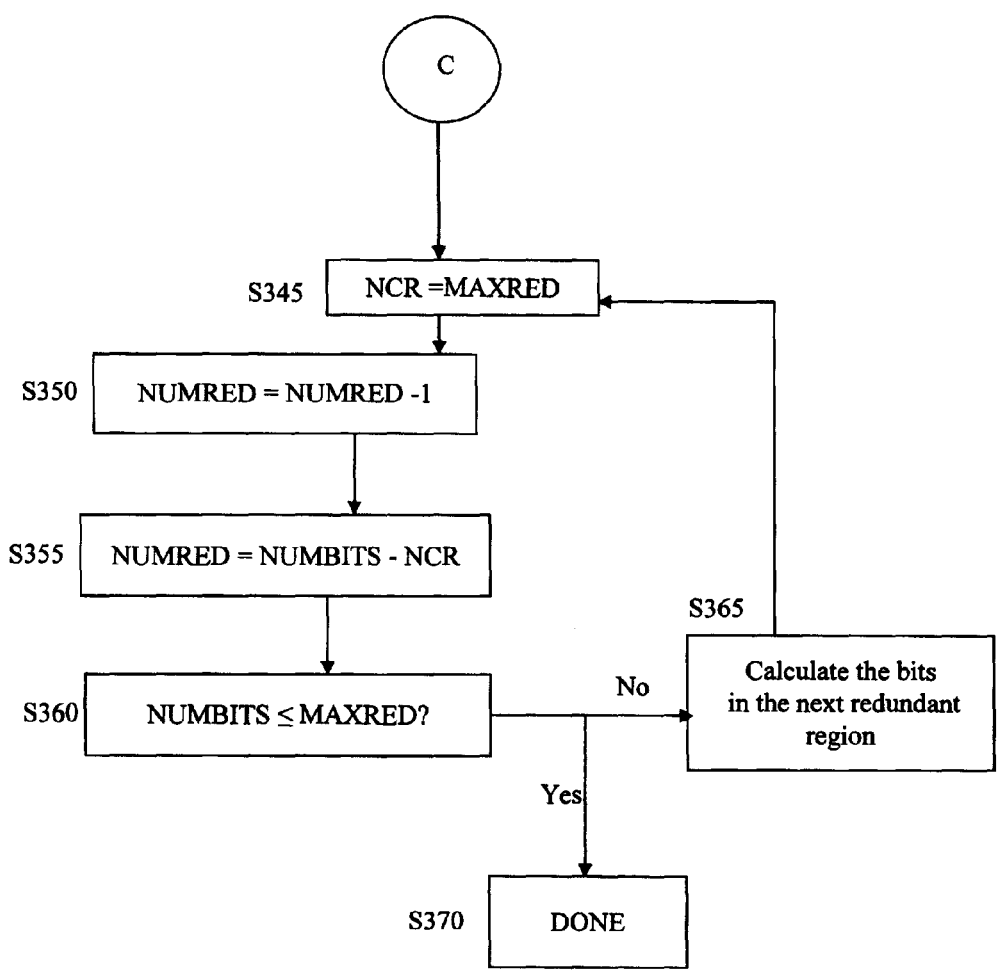

Referring to FIGS. 5 and 6, an example of determining redundant region size which is directed to minimizing the complexity of the memory redundancy allocation method between the redundant areas while minimizing real estate is shown. As in the previous examples, MAXRED is defined as a maximum number of bits that one redundant bit may correspond to replace (S300).

BLR is defined as the number of bits in a local redriver (S305). The number of bits for a half local redriver, BHLR, is defined as BLR divided by 2 (S310). After BHLR is defined, it is determined whether MAXRED/BHLR is an integer (S315). If MAXRED/BHLR is not an integer, MAXRED and/or BLR are adjusted (S320) and the logic flow goes back to S300.

The total number of bits in the memory column is defined as NUMBITS (S325), and it is determined whether NUMBITS is less than or equal to MAXRED (S330). If NUMBITS is less than or equal to MAXRED, all the bits of the memory column are in the redundant region and the logic flow is complete (S335). If NUMBITS is not less than or equal to MAXRED, NUMRED is set equal to the ceiling function of the ratio of NUMBITS to NUMRED (S340). The number of bits in the current redundant region, NCR is set equal to MAXRED (S345). Accordingly, the number of bits in the current redundant region has been determined as NCR.

It is then determined whether another redundant region is needed, where NUMRED is set equal to NUMRED minus 1 (S350). NUMBITS is set equal to NUMBITS minus NCR (S355). Accordingly, NUMBITS excludes the number of bits already calculated in the first redundant region for subsequent calculations. It is then determined whether NUMBITS is less than or equal to MAXRED (S360). If NUMBITS is less than or equal to MAXRED, the logic flow is complete (S370), and all of the bits are in the final redundant region. If NUMBITS is not less than or equal to MAXRED, the method calculates the number of bits in the next redundant region (S365) and the logic flow returns to step S325 with the new values of NUMRED and NUMBITS. Accordingly, the size of the redundant regions of a memory are determined with minimal complexity while also minimizing real estate consumed by the memory on the chip.

In other words, the third method consumes about the same area as the first method for high bit count memory systems, but uses a less complex procedure at the detriment of uneven redundancy allocation. In this method, the redundant bits are allocated so that the first region is always the same size. Thus if MAXRED is defined as 72 bits, and if two redundant regions are needed, the first region will have 72 bits and the second redundant region will have the remaining number of bits up to 72. For a high bit count SRAM this works well, but for a 73 bit count SRAM this leads to an allocation of 72 and 1 bits.

It should be understood that all of the methods work for more than 2 redundant regions. Also, as BLR is reduced and gets closer to 2 (and BHLR goes to 1), the redundancy allocation between regions become similar for the first and second methods.

Figure 7:
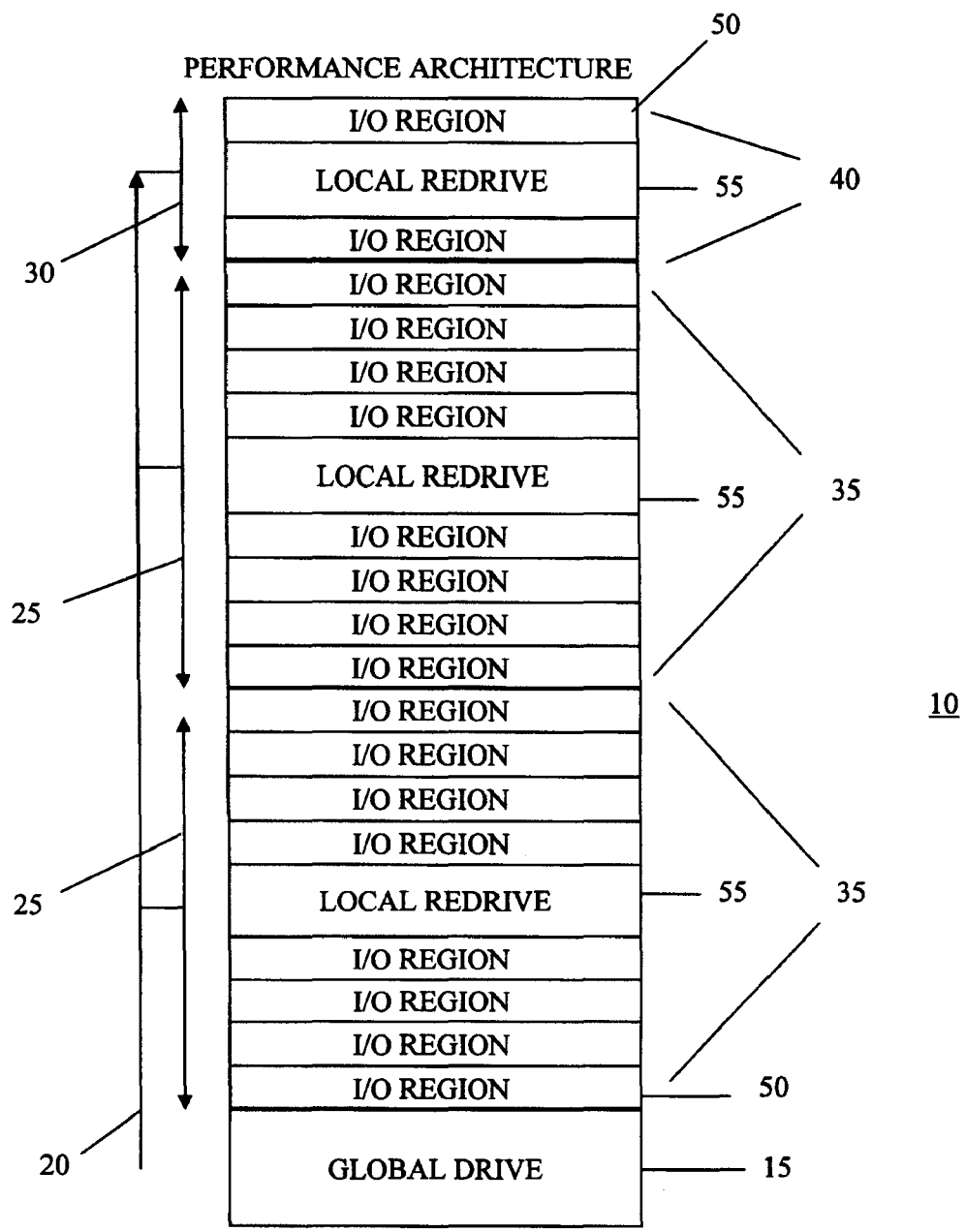
FIG. 7 is a schematic diagram of a memory with redrivers.

Referring to FIG. 7, a schematic diagram of an example of high performance architecture for a memory such as a compilable 1-port SRAM, is shown. The high performance architecture 10 communicates with a global drive 15 through a global bus connection 20. The high performance architecture 10 includes full local redrivers 35 and a partial local redriver of 40. Each full local redriver 35 includes I/O regions 50 and a local redriver 55. The full local redrivers 35 have a total of 8 I/O regions 50 each where the maximum number of I/O regions 50 on either side of the local redriver 55 is 4.

Also included in the high performance architecture 10 is a partial local redriver 40. Partial local redriver 40 has a local redriver 55 and I/O regions 50. The partial local redriver 40 can be distinguished from the full local redriver 35 by having fewer than 8 I/O regions 50. It should be noted that the I/O regions 50 of the partial redriver 40 can be arranged about the corresponding local redriver 55 in any pattern as long as no more than 4 I/O regions 50 are arranged on any one side of a local redriver 55 or of the partial local redriver 40, in this embodiment. It is contemplated, though, that other I/O regions are provided.

Accordingly, the high performance architecture achieves its high performance by subdividing a memory into redriver regions where each redriver region can be accessed simultaneously throughout the memory, thus allowing faster I/O operations. However, due to the addressing requirements of the local redrivers, a region of the memory, for which a redundant bit is available to replace a defective bit therein, must be pre-specified and thus, any redundant bit is not available to replace any defective bit in the memory. Accordingly, to achieve the most efficient allocation of redundant bits, the memory should be divided into redundant regions of substantially equal size where each redundant region corresponds to a redundant bit.

Figure 8:
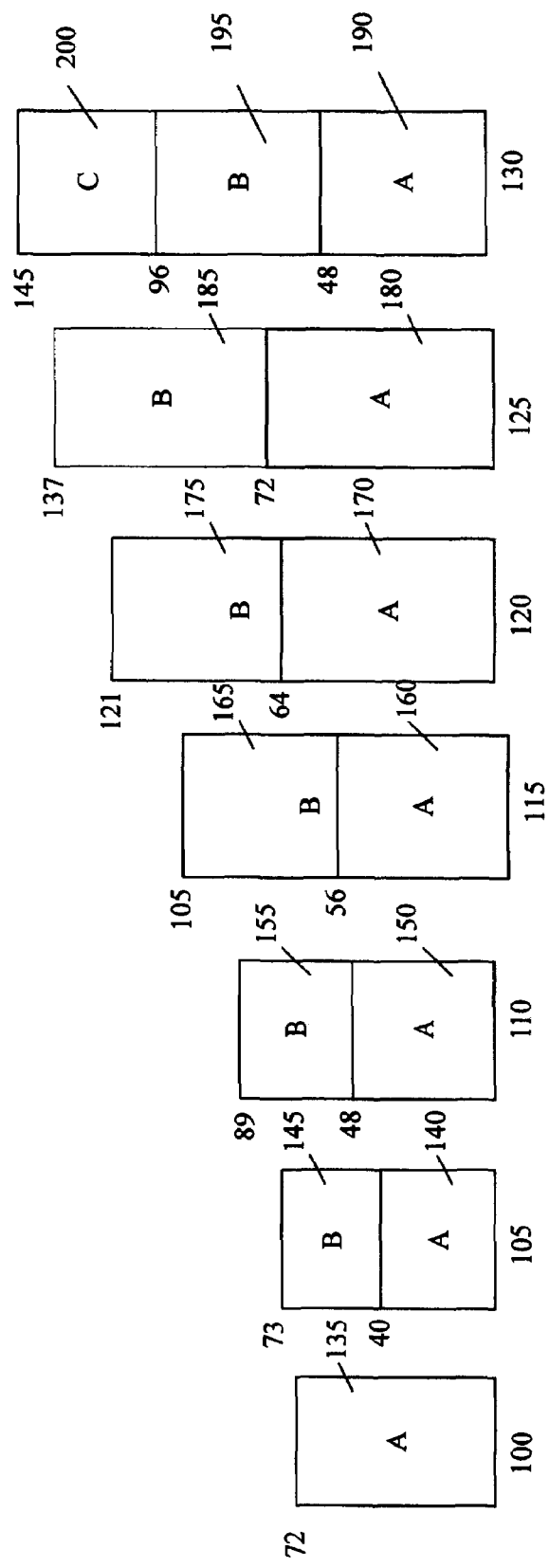
FIG. 8 illustrates redundant regions of memories in accordance with the invention.

Referring to FIG. 8, an illustration of redundant regions in memories of various sizes is shown. The various memory split points with redundant regions represented by A, B, C are determined by the method of FIGS. 1 and 2, where MAXRED equals 72 bits, BLR equals 16 bits and BHLR equals 8 bits. There are seven examples of memories 100, 105, 110, 115, 120, 125, and 130 shown, where each memory has a first redundant region denoted as A. The second through sixth memories have a second redundant region denoted as B, and the last memory has a third redundant region denoted as C. The first memory 100 has a total of 72 bits. The second memory 105 has a total of 73 bits. The third memory 110 has a total of 89 bits and the fourth memory 115 has a total of 105 bits. Additionally, the fifth memory 120 has a total of 121 bits, the sixth memory 125 has a total of 137 bits, and the seventh memory 130 has a total of 145 bits.

Since the first memory 100 has only a single redundant region, it has no split point. The second memory 105 has a split point between a first redundant region A 140 and the second redundant region B 145, at 40 bits. Additionally, the second redundant region B 145 has 33 bits. The third memory 110 has a split point between a first redundant region A 150 and a second redundant region B 155 at 48 bits. The second redundant region B 155 has 41 bits. The fourth memory 115 has a first redundant region A 160 and a second redundant region B 165 with a split point at 56 bits. Additionally, the second redundant region B 165 has 49 bits. The fifth memory 120 has a first redundant region A 170 and a second redundant region B 175 with a split point at 64 bits. The second redundant region B 175 has 57 bits.

The sixth memory 125 has a first redundant region A 180 and a second redundant region B 185 with a split point at 72 bits. The second redundant region B 185 has 65 bits. The seventh memory 130 has a first redundant region A 190 and a second redundant region B 195 with a split point at 48 bits. Additionally, the seventh memory 130 has a split point between the second redundant region B 195 and a third redundant region C 200 at 96 bits. The second region BI 95 has 48 bits. Third redundant region C 200 has 49 bits.

In the illustrative examples provided above, in each of the redundant regions, a redriver is provided at every sixteen (16) bits. Of course, different structures can also be used within the scope of the invention. Accordingly, FIG. 8 shows a schematic of the various memory structures and corresponding redundant regions which may be achieved with methods of allocating redundant regions according to FIGS. 1 and 2, with variations in the redundant region contemplated.

Figure 9:
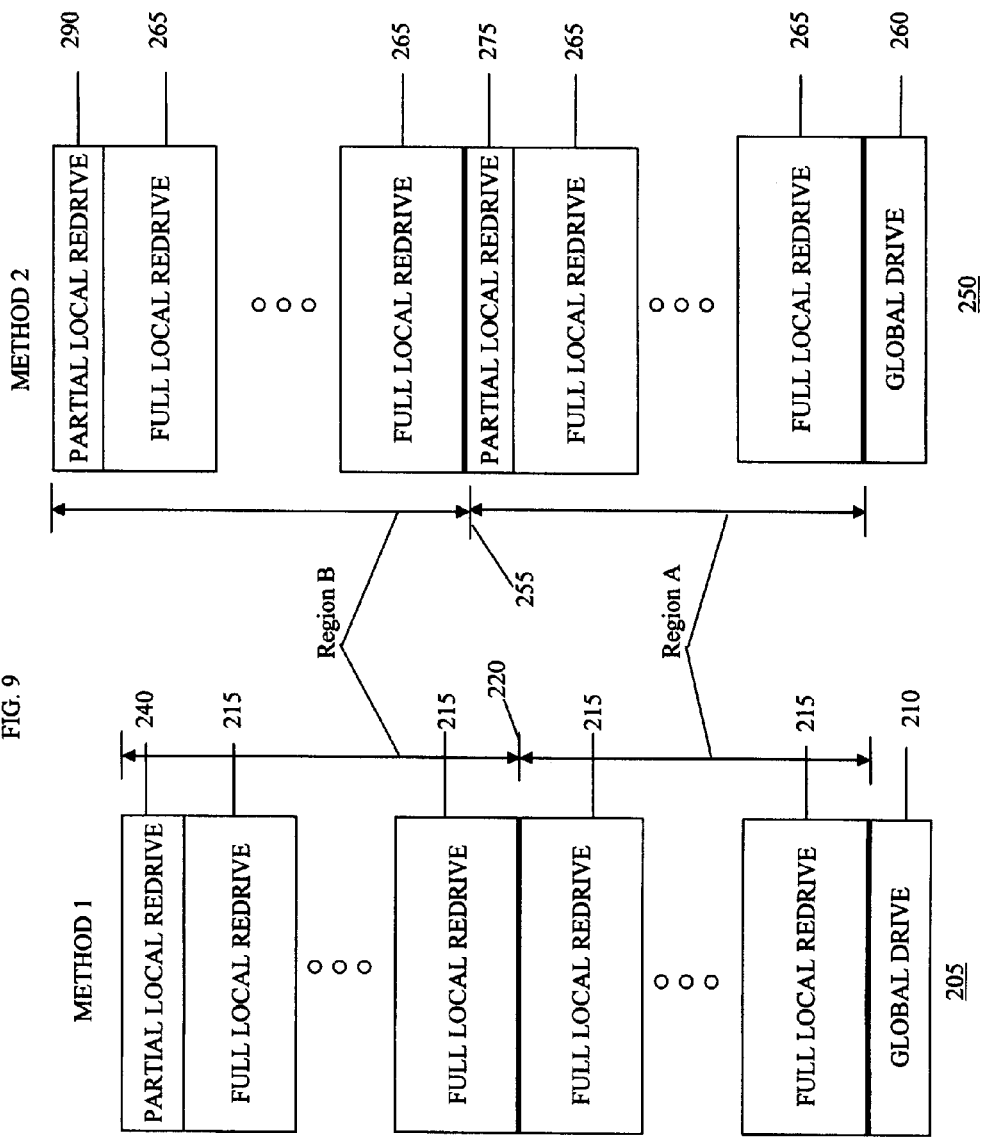
FIG. 9 illustrates memories in accordance with the invention.

Referring to FIG. 9, a graphical illustration comparing the real estate occupied by a memory 205 partitioned into redundant regions by the method of FIGS. 1 and 2 to a memory 250 partitioned into redundant regions by the method of FIGS. 3 and 4 is shown. It should be note that either method could be used to partition a memory in a particular region of a semiconductor, and thus the memories 205 and 250 represent at least two possible memory configurations for a region of a memory chip. The memory 205 of method 1 has a global drive 210 which communicates to the memory through a memory bus. The memory 205 is divided into a redundant region A and a redundant region B at a split point 220. The memory 205 includes full local redrivers in region A 215. In the second redundant region B are full local redrivers 215 and a partial local redriver 240.

The memory 250 includes a global drive 260 which communicates with the memory 250 through a memory bus. The memory 250 has a first redundant region A and a second redundant region B separated by a split point 255. The first redundant region A of the memory 250 includes full local redrivers 265 and a partial local redriver 275. The second redundant region B of the memory 250 includes full local redrivers 265 and includes a partial local redriver 290.

As represented in FIG. 9, the memory 205 will include at most one partial local redriver 240 located at the top or the end of the last redundant region B. However, the memory 250 associated with method 2 may include a partial local redriver 275 at the end of each redundant region, A and B, and thus may include more than one partial local redriver. Because partial local redrivers often occupy as much real estate as a full local redriver, but access less than 8 I/O regions, multiple partial local redrivers are an inefficient use of chip real estate. Accordingly, even though method 2 may be the most efficient allocation of redundant bits, method 2 may not necessarily provide the most efficient use of chip real estate as compared to method 1.

Referring to FIG. 10, the first column of data shows the number of bits in redundant regions of memory as determined by method 1, the second column of data corresponds to the number of bits in redundant regions of a memory as determined by method 2. Also, the third column of data corresponds to the number of bits in redundant regions of a memory as determined by method 3. The values are for an exemplary illustration of MAXRED of 72, BLR of 8, and BHLR of 4. The first entry of each row represents the total number of bits in the memory column. For example, for the first line where the total number of bits is 73 (NUMBITS=73), method 1 would produce two redundant regions where the first redundant region A has 36 bits, and the second redundant region B has 37 bits.

Additionally, method 2 would produce two redundant regions, A and B, where the first redundant region has 37 bits and the second redundant region has 36 bits. Finally, method 3 would also produce two redundant regions, A and B, where the first redundant region has 72 bits and the second redundant region has 1 bit. For the example of NUMBITS=144, method 1 would reduce two redundant regions, A and B, where the first redundant region has 72 bits and the second redundant region has 72 bits. Method 2 would produce two redundant regions, A and B, where the first redundant region has 72 bits and the second redundant region has 72 bits. Finally, the third method would produce two redundant regions, A and B, where the first redundant region has 72 bits and the second redundant region has 72 bits.

Looking at the next line where NUMBITS=145, method 1 would produce three redundant regions, A, B, and C, where the first redundant region has 48 bits, the second redundant region has 48 bits and the third redundant region has 49 bits. The second method would also produce three redundant regions, A, B, and C, where the first redundant region has 49 bits, the second redundant region has 48 bits and the third redundant region has 48 bits. Finally, the third method would also produce three redundant regions, A, B, and C, where the first redundant region has 72 bits, the second redundant region has 72 bits and the third redundant region has 1 bit. Accordingly, methods 1 and method 2 will allocate bits into redundant regions with about the same distribution while method 3 will allocate bits into redundant regions with a distribution which may not be equal.

Referring to FIG. 11, variable bit redundancy region boundaries in a compiled 1-port SRAM are shown where the first, second and third methods use MAXRED=72, BLR=16 and BHLR=8. For example, some of the data points from the method 1 column are graphically represented in FIG. 8. The first entry of each row is the total number of bits in the memory. Where the total number of bits is less than 72, each method will allocate all bits into a single redundant region. The first line where the number of bits equal 73, method 1 will form two redundant regions, A and B, where the first redundant region has 40 bits and the second redundant region has 33 bits. Method 2 will also form two redundant regions, A and B, where the first redundant region has 37 bits and the second redundant region has 36 bits. Finally, the third method will also create two redundant regions, A and B, where the first redundant region has 72 bits and the second redundant region has 1 bit.

Referring to the line corresponding to NUMBITS equals 144, method 1 will produce two redundant regions, A and B, where the first redundant region has 72 bits and the second redundant region has 72 bits. Similarly, method 2 will produce two redundant regions, A and B, where the first redundancy region has 72 bits and the second redundant region has 72 bits. Likewise, the third method will produce two redundant regions, A and B, where the first redundant region has 72 bits and the second redundant region has 72 bits.

Referring to the next line where the number of bits equals 145, the first method will produce three redundant regions, A, B, and C, where the first redundant region has 48 bits, the second redundant region has 48 bits and the third redundant region has 49 bits. Similarly, method 2 will produce three redundant regions, A, B, and C, where the first redundant region has 49 bits, the second redundant region has 48 bits, and the third redundant region has 48 bits. Finally, the third method will also produce three redundant regions, A, B, and C, where the first redundant region has 72 bits, the second redundant region has 72 bits and the third redundant region has 1 bit.

Figure 12:
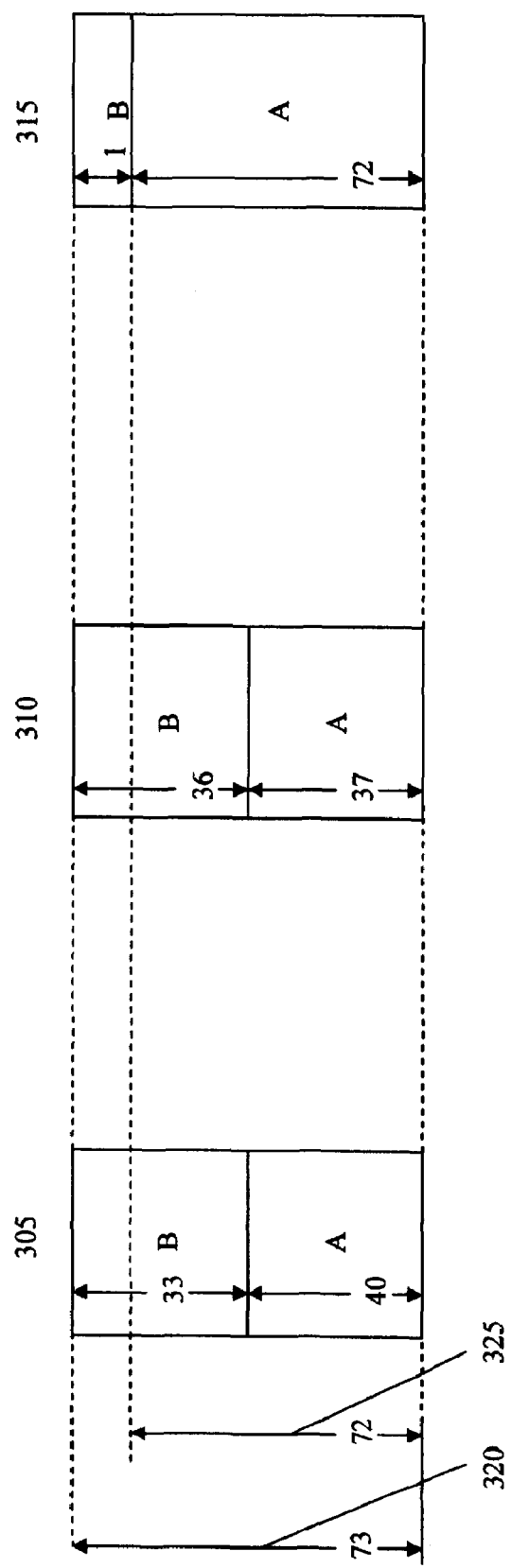
FIG. 12 illustrates redundant regions within a memory.

Referring to FIG. 12, redundant region allocations within a memory are shown for three methods of determining redundant region size where the total number of bits, NUMBITS, in the memory is 73, MAXRED is 72, BLR is 16, and BHLR is 8. In particular, a first memory 305 has first and second redundant regions, A and B, which are allocated or determined by the method of FIGS. 1 and 2. A second memory 310 has first and second redundant regions, A and B, which are allocated by the method of FIGS. 3 and 4. A third memory 315 has first and second redundant regions, A and B, which are allocated by the method of FIGS. 5 and 6.

Each memory, 305, 310 and 315, has a total number of bits 320 equal to 73. Additionally, each memory, 305, 310 and 315, has a maximum number of allowable bits for a redundant region 325 equal to 72. Accordingly, because the size 320 of each memory, 305, 310 and 315, is one bit larger than the maximum allowable size of a redundant region 325, each method will create two redundant regions, A and B, for each memory, 305, 310 and 315.

The first memory 305 was created by the method of FIGS. 1 and 2 which is optimized for achieving near equal redundancy allocation between redundant regions while minimizing chip real estate consumed by the memory. Accordingly, the first memory 305 has 40 bits in the first redundant region A, and 33 bits in the second redundant region B.

The second memory 310 was created by the method of the FIGS. 3 and 4 which is optimized for achieving substantially equal redundancy allocation between redundant regions by allowing for more than one partial redriver in the memory. Thus, the second memory 310 will typically occupy more chip real estate than the first memory 305. The second memory has a first redundant region A, with 37 bits and a second redundant region B, with 36 bits.

The third memory 315 was created by the method of FIGS. 5 and 6 which is optimized to have a simpler allocation process. Thus, the third memory 315 simply allocates the first 72 bits (which is the maximum allowable size of a redundant region) into redundant region A, and the remaining 1 bit into redundant region B.

While the invention has been described in terms of exemplary embodiments, those skilled in the art will recognize that the invention can be practiced with modifications and in the spirit and scope of the appended claims.

What is claimed is:

1. A method of creating a redundancy region in a compilable memory, comprising the steps of:
   determining a total number of bits for a memory;
   determining a maximum allowable number of bits for a redundant region;
   determining a total number of redundant bits based on a lowest integer which includes a ratio of a total number of bits for a memory to the maximum allowable number of bits for a redundant region;
   creating at least one redundant region on the memory based on the total number of redundant bits; and
   assigning a number of bits to the at least one redundant region.

2. The method of claim 1, further comprising allocating the total number of bits for the memory in a first redundant region if the total number of bits for the memory is less than or equal to the maximum allowable number of bits for a redundant region.

3. The method of claim 1, further comprising subtracting 1 from the total number of redundant bits to determine a number of remaining unallocated redundant bits.

4. The method of claim 3, further comprising subtracting a number of bits in a first redundant region of the at least one redundant region from the total number of bits for a memory to exclude the subtracted number of bits from being assigned to a remaining redundant region.

5. The method of claim 4, further comprising determining whether a total number of remaining bits exceeds the maximum allowable number of bits for a redundant region and, if so, then a remaining number of bits of the total number of bits for a memory are assigned to a remaining redundant region.

6. The method of claim 1, wherein the at least one redundant region comprises a number of bits such that only one redundant bit is allocated to the redundant region.

7. The method of claim 1, further comprising determining a size of the at least one redundant region by taking the smallest integer comprising the ratio of the total number of bits for the memory to a number of redundant bits.

8. The method of claim 7, further comprising determining the number of full size local redrivers in the at least one redundant region by taking the integer portion of the ratio of actual number of bits in the at least one redundant region to the number of bits per local redriver.

9. The method of claim 8, further comprising determining a size of a partial local redriver in the at least one redundant region by subtracting a product of the number of full size local redrivers and the number of bits of the local redriver from a size of the at least one redundant region.

10. The method of claim 9, further comprising subtracting a number of bits in a first redundant region of the at least one redundant region from the total number of bits for a memory to exclude the subtracted number of bits from being assigned to a remaining redundant region, and determining whether a total number of remaining bits exceeds the maximum allowable number of bits for a redundant region and, if not, then a remaining number of bits of the total number of bits for a memory are assigned to a remaining redundant region.

11. The method of claim 1, further comprising determining a number of bits per half local driver, and determining a number of half local redrivers in a redundant region based on a smallest integer which is greater than or equal to subtracting 0.5 from the ratio of the total number of bits for the memory to the product of the maximum allowable number of bits for a redundant region to the number of bits per half local redriver.

12. The method of claim 11, further comprising determining a number actual bits in a redundant region from the product of the number of half local redrivers and the number of bits per half local redriver.

13. The method of claim 11, further comprising subtracting a number of bits in a first redundant region of the at least one redundant region from the total number of bits for a memory to exclude the subtracted number of bits from being assigned to a remaining redundant region, and determining whether a total number of remaining bits exceeds the maximum allowable number of bits for a redundant region and, if not, then a remaining number of bits of the total number of bits for a memory are assigned to a remaining redundant region.

14. The method of claim 11, further comprising determining whether the total number of bits for a memory is less than or equal to the maximum allowable number of bits for a redundant region, and putting all the bits of the memory into a first redundant region, if yes, and determining a size of a redundant region if not.

15. A method of creating a redundancy region in a compilable memory, comprising the steps of:
defining a total number of bits for a memory;
defining a maximum allowable number of bits for a redundant region of the memory, where a redundant bit may replace any one of the bits in a corresponding redundant region;
defining an actual number of redundant bits for the memory as a lowest integer which is equal to or greater than a ratio of the total number of bits in the memory to the maximum allowable number of bits for a redundant region;
defining an actual number of bits for a first redundant region as a lowest integer which is equal to or greater than a ratio of the total number of bits for the memory to the number of redundant bits for the memory; and
configuring the memory so that a first redundant bit of the number of redundant bits may replace any bit of the actual number of bits for the first redundant region.

16. The method of claim 15, further comprising redefining the number of redundant bits to be the number of redundant bits minus 1, and redefining the total number of bits for the memory to be the total number of bits for the memory minus the actual number of bits for the first redundant region, and creating a second redundant region according to claim 15 if the total number of bits for the memory exceeds the maximum allowable number of bits for a redundant region and assigning a remaining number of bits of the total number of bits for a memory to a remaining redundant region if the total number of bits for the memory doesn't exceed the maximum allowable number of bits for a redundant region.

17. The method of claim 15, further comprising allocating the total number of bits for the memory in a first redundant region if the total number of bits for the memory is less than or equal to the maximum allowable number of bits for a redundant region.

18. The method of claim 15, further comprising defining a number of bits for a local redriver, where the memory comprises at least one local redriver, and defining a number of bits per half local redriver where the number of bits per half local redriver is half the number of bits for a local redriver, wherein the memory comprises at least one half local redriver, and defining a number of half local redrivers in the memory as the smallest integer greater than or equal to a result of subtracting 0.5 from the ratio of the total number of bits of the memory divided by the product of the number of redundant bits and the number of bits per half local redriver.

19. The method of claim 18, further comprising redefining the number of redundant bits to be the number of redundant bits minus 1, and redefining the total number of bits for the memory to be the total number of bits for the memory minus the actual number of bits for the first redundant region, and creating a second redundant region according to claim 15 if the total number of bits for the memory exceeds the maximum allowable number of bits for a redundant region, and further comprising assigning a remaining number of bits of the total number of bits for a memory to a remaining redundant region if the total number of bits for the memory does not exceed the maximum allowable number of bits for a redundant region.

20. A computer program product comprising a computer usable medium having readable program code embodied in the medium, the computer program product includes at least one component to:
determine a total number of bits for a memory;
determine a maximum allowable number of bits for a redundant region;
determine a total number of redundant bits based on a lowest integer which includes a ratio of the total number of bits for a memory to the maximum allowable number of bits for a redundant region;
create at least one redundant region of the memory based on the total number of redundant bits; and
assign a number of bits to the at least one redundant region.

* * * * *